US012811560B2

(12) United States Patent
Goto et al.

(10) Patent No.: US 12,811,560 B2
(45) Date of Patent: Nov. 24, 2026

(54) PACKAGED ACOUSTIC WAVE DEVICES WITH MULTILAYER PIEZOELECTRIC SUBSTRATE

(71) Applicant: SKYWORKS SOLUTIONS, INC., Irvine, CA (US)

(72) Inventors: Rei Goto, Osaka (JP); Hironori Fukuhara, Ibaraki (JP)

(73) Assignee: SKYWORKS SOLUTIONS, INC., Irvine, CA (US)

(*) Notice: Subject to any disclaimer, the term of this patent is extended or adjusted under 35 U.S.C. 154(b) by 663 days.

(21) Appl. No.: 18/214,611

(22) Filed: Jun. 27, 2023

(65) Prior Publication Data

US 2024/0007079 A1 Jan. 4, 2024

Related U.S. Application Data

(60) Provisional application No. 63/367,381, filed on Jun. 30, 2022.

(51) Int. Cl.

| | |
|---|---|
| ***H03H 9/10*** | (2006.01) |
| ***H03H 3/08*** | (2006.01) |
| ***H03H 9/02*** | (2006.01) |
| ***H03H 9/25*** | (2006.01) |

(52) U.S. Cl.
CPC .......... *H03H 9/02929* (2013.01); *H03H 3/08* (2013.01); *H03H 9/1085* (2013.01); *H03H 9/25* (2013.01)

(58) Field of Classification Search
CPC ..... H03H 9/02929; H03H 9/1085; H03H 9/25
See application file for complete search history.

(56) References Cited

U.S. PATENT DOCUMENTS

| | | | |
|---|---|---|---|
| 5,646,584 | A | 7/1997 | Kondratyev et al. |
| 7,230,512 | B1 | 6/2007 | Carpenter et al. |
| 9,438,201 | B2 | 9/2016 | Hori et al. |
| 12,519,451 | B2 | 1/2026 | Huang et al. |
| 2014/0339957 | A1 | 11/2014 | Tajima et al. |
| 2017/0063332 | A1 | 3/2017 | Gilbert et al. |
| 2017/0214386 | A1 | 7/2017 | Kido |
| 2017/0222618 | A1 | 8/2017 | Inoue et al. |
| 2017/0250669 | A1 | 8/2017 | Kuroyanagi et al. |
| 2017/0272051 | A1 | 9/2017 | Kurihara et al. |
| 2017/0273183 | A1 | 9/2017 | Kawasaki et al. |
| 2017/0288629 | A1 | 10/2017 | Bhattacharjee et al. |
| 2017/0359048 | A1 | 12/2017 | Yasuda |
| 2018/0013404 | A1 | 1/2018 | Kawasaki et al. |
| 2018/0316329 | A1 | 11/2018 | Guenard et al. |
| 2018/0367119 | A1 | 12/2018 | Lee |

(Continued)

*Primary Examiner* — Bryan P Gordon
(74) *Attorney, Agent, or Firm* — Lando & Anastasi, LLP

(57) ABSTRACT

A packaged acoustic wave component comprises a substrate having a trap-rich layer arranged at a surface of the substrate, a functional layer disposed over the surface of the substrate such as to cover that surface, a piezoelectric layer disposed over the functional layer and covering the functional layer with the exception of a peripheral portion of the functional layer, a first metal layer comprising an electrode structure disposed over the piezoelectric structure, and a second metal layer disposed partially in contact with the first metal layer and partially in contact with the peripheral portion of the functional layer.

16 Claims, 8 Drawing Sheets

(56) References Cited

U.S. PATENT DOCUMENTS

| | | | |
|---|---|---|---|
| 2019/0288661 | A1 | 9/2019 | Akiyama et al. |
| 2020/0067482 | A1 | 2/2020 | Maki et al. |
| 2020/0366270 | A1 | 11/2020 | Matsuoka |
| 2021/0058057 | A1 | 2/2021 | Goto et al. |
| 2021/0159886 | A1 | 5/2021 | Goto et al. |
| 2022/0014175 | A1 | 1/2022 | Nagatomo et al. |
| 2022/0077840 | A1 | 3/2022 | Caron |
| 2022/0109419 | A1* | 4/2022 | Esquius Morote .. H03H 9/1452 |
| 2022/0131125 | A1* | 4/2022 | Yushin .................... C23C 16/30 |
| 2022/0209738 | A1* | 6/2022 | Torazawa ........... H03H 9/14538 |
| 2023/0026465 | A1 | 1/2023 | Huang et al. |
| 2023/0327635 | A1* | 10/2023 | Hill ....................... C01B 32/907 |
| 2023/0336145 | A1 | 10/2023 | Goto et al. |
| 2023/0403939 | A1 | 12/2023 | Goto et al. |

* cited by examiner

PACKAGED ACOUSTIC WAVE DEVICES WITH MULTILAYER PIEZOELECTRIC SUBSTRATE

CROSS-REFERENCE TO RELATED APPLICATIONS

This application claims priority under 35 U.S.C. § 119(e) to U.S. Provisional Patent Application Ser. No. 63/367,381, titled "PACKAGED ACOUSTIC WAVE DEVICES WITH MULTILAYER PIEZOELECTRIC SUBSTRATE," filed Jun. 30, 2022, the entire content of which is incorporated herein by reference for all purposes.

BACKGROUND

Technical Field

Embodiments of this disclosure relate to acoustic wave devices, in particular to packaged acoustic wave components, which may also be designated as acoustic wave component packages.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

The packaging process for multilayer piezoelectric substrate packages with an acoustic wave device, so as to produce a packaged acoustic wave component, can apply stresses to the piezoelectric layer (e.g., during heat cycle testing) that can result in reliability issues including cracking of the piezoelectric layer.

SUMMARY

Accordingly, there is a need for a packaged acoustic wave component, in particular a surface acoustic wave (e.g., SAW or TCSAW) package with improved reliability that can withstand the stresses (e.g., from heat cycle testing) during the packaging process.

In the prior art, it is known that cross-talk between different signal may be reduced when the base substrate of the packaged acoustic wave component has a trap-rich silicon layer. These traps are configured as crystal defects which act as recombining centers. They can trap carriers, thus decreasing parasitic surface conduction (PSC) that is known to introduce non-linear distortions into radio frequency signals.

Moreover, most packaged acoustic wave components of the type described herein have a dielectric layer covering the trap rich layer of the substrate completely. On the dielectric layer, a piezoelectric layer is disposed. It has been found by the inventors that stress, especially within the sensitive piezoelectric layer, can be reduced when the piezoelectric layer is recessed from the lateral edge of the component, i.e., from the lateral edge of the substrate. In this context, it has been found that removing the dielectric layer from the trap rich layer can lead to re-activation of the parasitic surface conduction by subsequent oxidation of the uncovered silicon surface of the trap rich layer.

The present invention provides a packaged acoustic wave component and devices based thereon, which provide both decreased parasitic surface conduction as well as reduced stress on the piezoelectric layer. Moreover, the invention provides a method for providing (or: forming) such a packaged acoustic wave component.

In accordance with one aspect of the disclosure, a packaged acoustic wave component comprises a substrate having a trap-rich layer arranged at a surface of the substrate, a functional layer disposed over the surface of the substrate such as to cover that surface, a piezoelectric layer disposed over the functional layer and covering the functional layer with the exception of a peripheral portion of the functional layer, a first metal layer comprising an electrode structure disposed over the piezoelectric structure, and a second metal layer disposed partially in contact with the first metal layer and partially in contact with the peripheral portion of the functional layer.

In accordance with one aspect of the disclosure, a method of making a packaged acoustic wave component comprises the steps of forming or providing a substrate having a trap-rich layer arranged at a surface of the substrate, forming or providing a functional layer over the surface of the substrate such as to cover that surface, forming or providing a piezoelectric layer over the functional layer which covers the functional layer with the exception of a peripheral portion of the functional layer, forming or providing a first metal layer comprising an electrode structure over the piezoelectric structure, and forming or providing a second metal layer partially in contact with the first metal layer and partially in contact with the peripheral portion of the functional layer.

BRIEF DESCRIPTION OF THE DRAWINGS

Embodiments of this disclosure will now be described, by way of non-limiting example, with reference to the accompanying drawings.

DETAILED DESCRIPTION

Figure 1:
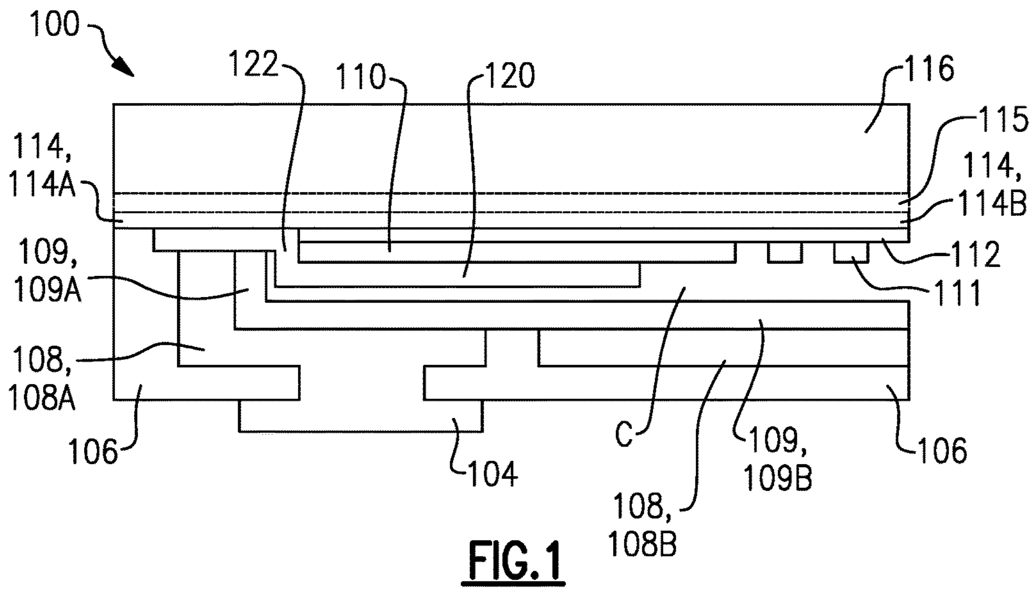
FIG. 1 illustrates a schematic cross-sectional side view of a packaged acoustic wave component according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters). Any features of the SAW resonators and/or devices discussed herein can be implemented in any suitable SAW device.

In general, high quality factor (Q), large effective electromechanical coupling coefficient ($k^2$), high frequency ability, and spurious free response can be significant aspects for acoustic wave elements to enable low-loss filters, delay lines, stable oscillators, and sensitive sensors.

Multi-layer piezoelectric substrate (MPS) SAW resonators can thermally insulate an interdigital transducer electrode and a piezoelectric layer. By reducing dissipative thermal impedance of the SAW device, the ruggedness and power handling can be improved.

Some MPS SAW resonators have achieved high Q by confining energy and good thermal dissipation using a silicon (Si) support layer. However, such approaches have encountered technical challenges related to undesirable higher frequency spurious responses.

Some other MPS SAW resonators have achieved high Q by confining energy and have also reduced higher frequency spurious responses. However, such approaches have encountered relatively low thermal heat dissipation.

Aspects of the present disclosure relate to SAW resonators that include a support substrate or layer (e.g., a single crystal supporting substrate), a functional layer (e.g., a dielectric layer) over the support substrate or layer, a piezoelectric layer (e.g., a lithium niobate (LN or $LiNbO_3$) layer or a lithium tantalate (LT or $LiTaO_3$) layer) over the functional layer, and an interdigital transducer (IDT) electrode over the piezoelectric layer. Such SAW resonators can also include a temperature compensation layer (e.g., silicon dioxide ($SiO_2$) layer) over the IDT electrode in certain embodiments. The SAW resonators can also include an adhesion layer disposed between the support substrate and the functional layer and/or an adhesion layer between the functional layer and the piezoelectric layer, in certain implementations.

SAW resonators with the functional layer and the support layer or substrate can beneficially provide a relatively high effective electromechanical coupling coefficient ($k^2$), a relatively high quality factor (Q), a relatively high power durability and thermal dissipation, and reduced high frequency spurious responses. The high coupling coefficient ($k^2$) can be beneficial for relatively wide bandwidth filters. The high quality factor (Q) can beneficially lead to a relatively low insertion loss. The reduced high frequency spurious may make the SAW resonators compatible with multiplexing with higher frequency bands.

In an embodiment, an MPS SAW resonator includes a piezoelectric layer over a functional layer over a silicon support substrate or layer. The silicon support substrate can reduce thermal impedance of the MPS SAW resonator. The functional layer can be a single crystal layer arranged to confine acoustic energy and lower a higher frequency spurious response. The piezoelectric layer, the functional layer, and the silicon support substrate can all be single crystal layers.

Embodiments of MPS SAW resonators (e.g., packages) will now be discussed. Any suitable principles and advantages of these MPS SAW resonators can be implemented together with each other in an MPS SAW resonator and/or in an acoustic wave filter. MPS SAW resonators (e.g., packages) disclosed herein can have lower loss than certain bulk acoustic wave devices.

FIG. 1 illustrates a packaged acoustic wave component 100 (e.g., a multi-layer piezoelectric substrate (MPS) package or structure) according to an embodiment. FIG. 1 shows a lateral end portion of a cross-section through the packaged acoustic wave component 100, which is cut off to the right. The component 100 has a substrate 116 with a trap rich layer 115 formed at one surface thereof. Over this surface, an additional (e.g., functional, dielectric) structure or layer 114 is disposed over (e.g., bonded to) the substrate 116 and in particular over the trap rich layer 115. In the following, sometimes specifically the example of a dielectric layer 114 will be described. However, it shall be understood that the functional layer may also consist of, or comprise, any other type of layer and therefore fulfill any other kind of function. The functional layer 114 may comprise, for example, silicon ducts to improve thermal properties and/or the temperature coefficient of frequency (TCF). Advantageously, the functional layer 114 covers the entire surface of the trap rich layer 115 of the substrate 116. In this way, an oxidation of the trap rich layer 115 is prevented such that parasitic surface conduction is not re-activated. In this state, then, the trap rich layer 115 continues to prevent, or at least significantly reduce, cross-talk of signals.

A piezoelectric structure or layer 112 is disposed over (e.g., bonded to) the functional layer 114. The piezoelectric layer 112 may comprise, or consist of, lithium niobate (LN or $LiNbO_3$) or lithium tantalate (LT or $LiTaO_3$). Advantageously, the piezoelectric layer 112 does not cover the functional layer 114 entirely: a peripheral portion 114A of the functional layer 114 is left uncovered by the piezoelectric layer 112. The piezoelectric layer 112 only covers the remaining, main portion 114B of the functional layer 114. In this embodiment, the peripheral portion 114A and the main portion 114B of the functional layer 114 have the same thickness and are made of the same material; they only differ in where they are arranged and in whether or not they are covered by the piezoelectric layer 112.

As will be illustrated with respect to FIG. 5 later, it is preferred that the peripheral portion 114A runs along the entire periphery of the packaged acoustic wave component 100, that it, along all four edges. In this way, the sensitive piezoelectric layer 112 is recessed from the lateral edges of the packaged acoustic wave component 100, which has been found to render it less susceptible to stress. Herein, the lateral direction will be understood to be a direction parallel to the surface of the trap rich layer 115 of the substrate 116 and from inside the packaged acoustic wave component 100 to the outside, i.e., to its edges. It shall be understood that the arrangements in the cross-sections shown in FIG. 1 through FIG. 4 may equally be applied for all four edges of the respective packaged acoustic wave component 100. Thus, whenever an edge or a lateral end or the like is mentioned, it shall be understood that this may pertain to all of the respective edges. This is true in particular for the descriptions of the piezoelectric layer, the functional layer, and a polymeric buffer element. The first and the second metal layer will usually be only locally formed to provide signal lines.

An electrode structure, specifically an interdigital transducer (IDT) electrode 111, is disposed on (e.g., connected to) the piezoelectric layer 112 as part of a first metal layer 110. The first metal layer 110 may, in addition to comprising the IDT electrode 111, also contribute to conducting signals from and to the IDT electrode 111. In some embodiments, the lateral edge of the first metal layer 110 coincides with the lateral edge of the piezoelectric layer 112 so that these two layers may be said to have the same lateral edge. In FIG. 1, this common lateral edge is arranged perpendicular to the surface of the trap rich layer 115 of the substrate 116. In general there is a plurality of IDT electrodes 111 comprised by each packaged acoustic wave component 100. As an example, FIG. 5 later shows an example with four IDT electrodes 111.

On the first metal layer 110, a second metal layer 120 can be provided which usually has a higher thickness than the first metal layer 110 to reduce its electrical resistivity. However, the thickness of the second metal layer 120 may be the same, or may be smaller than the first metal layer 110 as well. The second metal layer 120 may be used to form signal lines connecting the IDT electrode 111 to contact terminals of the packaged acoustic wave component 100, e.g., to solder connections 104.

The second metal layer 120 is arranged partially in contact with the first metal layer 110. This means that not the entire first metal layer 110 will be in contact with the second metal layer 120—in particular not the IDT electrodes 111—and also not the entire second metal layer 120 will be in contact with the first metal layer 110. In particular, the second metal layer 120 laterally extends over the common lateral edge of piezoelectric layer 112 and first metal layer 110 onto the surface of the peripheral portion 114A of the functional layer 114.

The portion of the second metal layer 120 arranged where the peripheral portion 114A transitions into the main portion 114B of the functional layer 114 may be designated as a transition portion 122. In the example of FIG. 1, the transition portion 122 extends along the common lateral edge of the piezoelectric layer 112 and the first metal layer 110 and then along the peripheral portion 114A. The transition portion 122 therefore in this example contains two angles.

With continued reference to FIG. 1, a thermally conductive structure or package is connected to the substrate 116 via at least piezoelectric layer 112 and functional (specifically, dielectric) layer 114. The thermally conductive structure or package includes a metal structure 108 and a polymer structure 109 disposed over at least a portion of the metal structure 108. The polymer structure 109 may in particular comprise, or consist of, a polyimide material and/or a polybenzoxazole (PBO) material.

The metal structure 108 and the polymer structure 109 are shaped so that a cavity C (e.g., open or hollow cavity, air cavity) exists between at least a portion of the polymer structure 109 and at least a portion of the piezoelectric layer 112. The cavity C houses (or: encloses) the IDT electrode 111 and may house (or: enclose) the functional layer 114 and/or the piezoelectric layer 112 partially or completely. The polymer structure 109 may thus comprise a polymer structure wall portion 109A (forming the walls of the cavity C) and a polymer structure roof portion 109B (forming the roof of the cavity C). The metal structure 108 can be made of copper (Cu). The metal structure 108 may comprise a metal structure wall portion 108A and a metal structure roof portion 108B arranged in contact with the polymer structure wall portion 109A and the polymer structure roof portion 109B, respectively.

A buffer coating (or dielectric overcoat) 106) is disposed over at least a portion of the metal structure 108. The buffer coating 106 may comprise any suitable polymer which may be chosen such as to provide a desired hardness. One or more solder connections 104 are disposed on the metal structure 108 so that the metal structure 108 is between the solder connections 104 and the piezoelectric layer 112. The metal structure 108 connects to the piezoelectric layer 112 via—not depicted—signal line(s) in the second metal layer 120.

In the shown cross-section, two solder connections 104 (or solder terminal external electrodes) are directly electrically connected via the metal structure 108. This may be done for ground, GND, solder connections 104 (or GND terminals) to enforce GND stability. Typically, another, electrically separate solder connection 104 (not shown in FIG. 1) will be provided as a signal electrode, in the same layer(s) but without direct electrical connection to the GND solder connections 104 within the metal structure 108. A lateral end of the second metal layer 120 is directly interposed between the metal structure 108 and the buffer coating 106 on one side, and the peripheral portion 114A on the other side.

Figure 2:
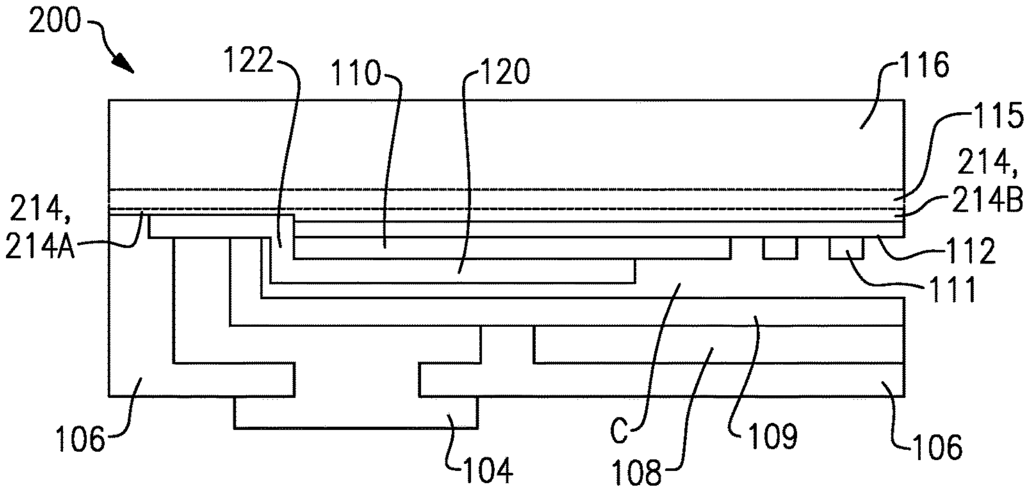
FIG. 2 illustrates a schematic cross-sectional side view of a packaged acoustic wave component according to another embodiment.

FIG. 2 shows a packaged acoustic wave component 200 (e.g., a multi-layer piezoelectric substrate (MPS) package or structure) according to another embodiment. The packaged acoustic wave component 200 is a variant of the packaged acoustic wave component 100 and differs from it in that a functional layer 214 is provided instead of the functional layer 114, wherein the differences are in form and size only, not (or not necessarily) in material. In this embodiment, the thickness of the peripheral portion 214A is smaller than the thickness of the main portion 214B. This provides the packaged acoustic wave component 100 with an overall reduced size. At the same time, even a peripheral portion 214A with reduced thickness is sufficient to cover the trap rich layer 115 of the substrate 116 so as to prevent re-activation of parasitic surface conductivity, especially during a time in which the thermally conductive structure or package is not (yet) connected to the substrate 116.

Figure 3:
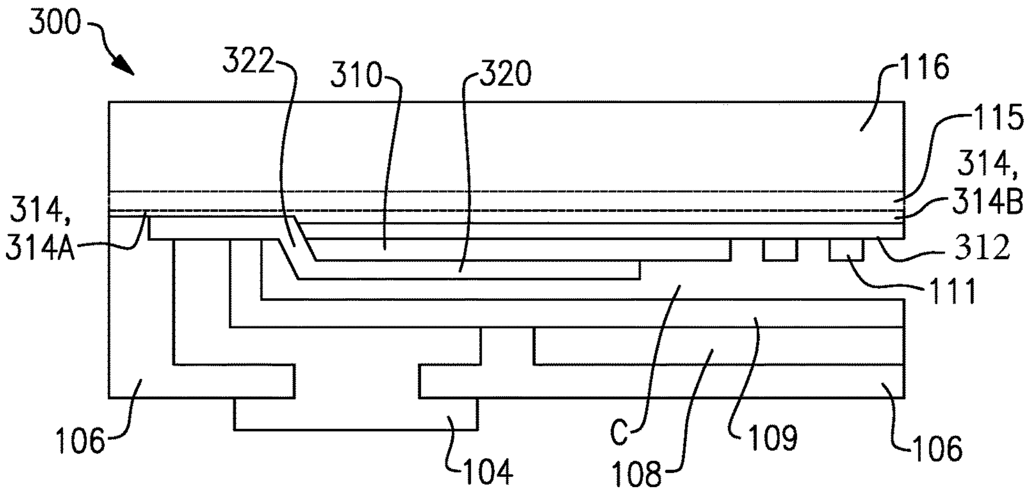
FIG. 3 illustrates a schematic cross-sectional side view of a packaged acoustic wave component according to yet another embodiment.

FIG. 3 shows a packaged acoustic wave component 300 (e.g., a multi-layer piezoelectric substrate (MPS) package or structure) according to another embodiment. The packaged acoustic wave component 300 is a variant of the packaged acoustic wave component 200 and differs from it in that a functional layer 314 is provided instead of the functional layer 114, a piezoelectric layer 312 is provided instead of the piezoelectric layer 112, a first metal layer 310 is provided instead of the first metal layer 110, and in that a second metal layer 320 is provided instead of the second metal layer 120, wherein the differences are in form and size only, not (or not necessarily) in material. One main difference between the packaged acoustic wave component 300 and the packaged acoustic wave component 200 is that in the packaged acoustic wave component 300 the piezoelectric layer 312 and the first metal layer 310 have a tapered shape, tapering down when moving away from the substrate 116. This means that the common lateral edge of the piezoelectric layer 312 and the first metal layer 310 is slanted away from the peripheral portion 314A. The transition portion 322 of the second metal layer 320 therefore has a cross-section with two obtuse angles larger than 90 degrees. Coming from the center of the packaged acoustic wave component 300, the second metal layer 320 first bends towards the substrate 116 in the first obtuse angle, following the slanted common edge of the piezoelectric layer 312 and the first metal layer 310, and then bends away from the substrate 116 in a second obtuse angle, then running parallel to the functional layer 314 along the peripheral portion 314A thereof. The packaged acoustic wave component 300 of FIG. 3 is especially advantageous regarding signal propagation within the second metal layer 320. The transition from the main portion 314B of the functional layer 314 to the peripheral portion 314A of the functional layer 314 may also be formed such that the main portion 314B has a tapered edge which extends the common tapered edge of the piezoelectric layer 312 and the first metal layer 310.

Figure 4:
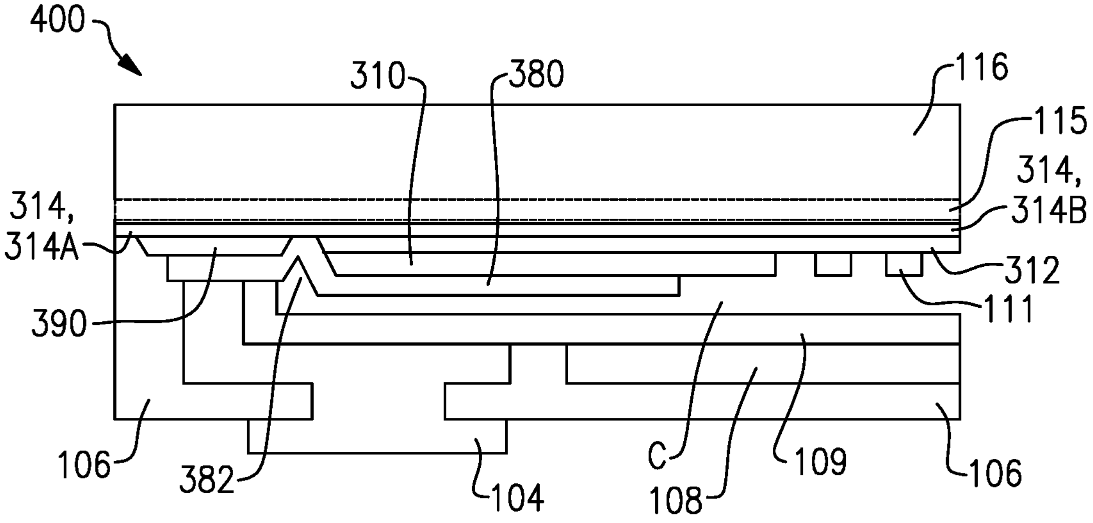
FIG. 4 illustrates a schematic cross-sectional side view of a packaged acoustic wave component according to still another embodiment.

FIG. 4 shows a packaged acoustic wave component 400 (e.g., a multi-layer piezoelectric substrate (MPS) package or structure) according to another embodiment. The packaged acoustic wave component 400 is a variant of the packaged acoustic wave component 300 and differs from it in that a second metal layer 380 is provided instead of the second metal layer 320, wherein the differences are in form and size only, not (or not necessarily) in material, and in that there is an additional polymeric buffer element 390.

The polymeric buffer element 390 is arranged (or: sandwiched) directly between the peripheral portion 314A of the functional layer 314 on one side, and the lateral end of the second metal layer 380 on the other side. The second metal layer 380 is formed such as to run along the common slanted lateral edge of the first metal layer 310 and the piezoelectric layer 312, and to touch the peripheral portion 314A before touching and covering the polymeric buffer element 390. The polymeric buffer element 390 may comprise, or consist of, a polymer such as a polyimide. The polymeric buffer element 390 further reduces stress and increases the ruggedness of the packaged acoustic wave component 400. The polymeric buffer element 390 may in the lateral direction extend further than the second metal layer 380 as shown in FIG. 4 such that the buffer coating is arranged in part also on the polymeric buffer element 390.

The polymeric buffer element 390 may also have one or more slanted edges such that the polymeric buffer element 390 also tapers with increasing distance from the surface of the substrate 116. Specifically, a side of the polymeric buffer element 390 facing the interior of the packaged acoustic wave component 400, i.e., facing the piezoelectric layer 312 may be wider than the opposite side. The transition portion 382 of the second metal layer 380 may comprise a V-shape in its cross-section, formed between the slanted common edge of piezoelectric layer 312 and the first metal layer 310 on one side, and the slanted edge of the polymeric buffer element 390 on the other side.

Moving along the cross-section of the second metal layer 380 starting from the first metal layer 310, the second metal layer 380 first runs in parallel to the substrate 116, then turns towards the substrate 116 in an obtuse angle, then—forming the V-shape—away from the substrate 116 in an acute angle, then finally again towards the substrate 116 in an obtuse angle so as to run parallel to the substrate 116 and the surface of the polymeric buffer element 390.

The polymeric buffer element 390 and the transition portion 382 of the second metal layer 380 may be formed in the above described manner along all four edges of the packaged acoustic wave component 400. In a horizontal cross-section at the height of the piezoelectric layer 312, therefore, the piezoelectric layer 312 may be completely surrounded on all sides by the second metal layer 380, specifically by the flat tip portion of the V-shape in the transition portion 382. That tip portion may in turn then be completely surrounded on all sides by the polymeric buffer element 390, which in turn may then be completely surrounded on all sides by the buffer coating 106.

Figure 5:
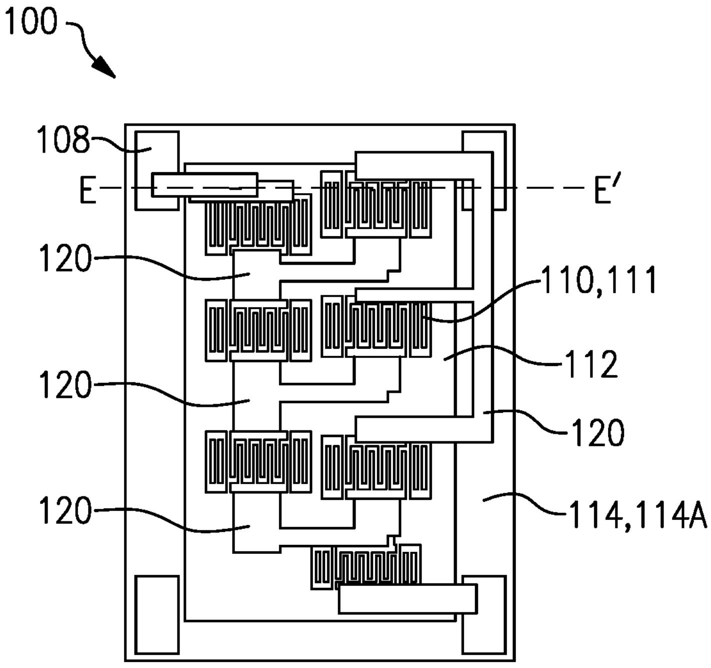
FIG. 5 illustrates a schematic top down view on some elements of the packaged acoustic wave component of FIG. 1.

FIG. 5 shows a schematic top-down view illustrating the arrangement of the piezoelectric layer 112 and the main portion 114A of the functional layer 114 in the embodiment of FIG. 1. The cross-section of FIG. 1 may be taken, for example, along the left part of the line E-E' in FIG. 5. As has been described, the piezoelectric layer 112 is recessed from the lateral edge of the packaged acoustic wave component 100 on all sides so as to reduce stress. At the same time, the peripheral portion 114A of the functional layer 114 covers the remaining portions of the substrate 116, in particular the trap rich layer 115, completely in order to avoid re-activation of parasitic surface conduction by oxidation of the silicon surface.

Figure 6:
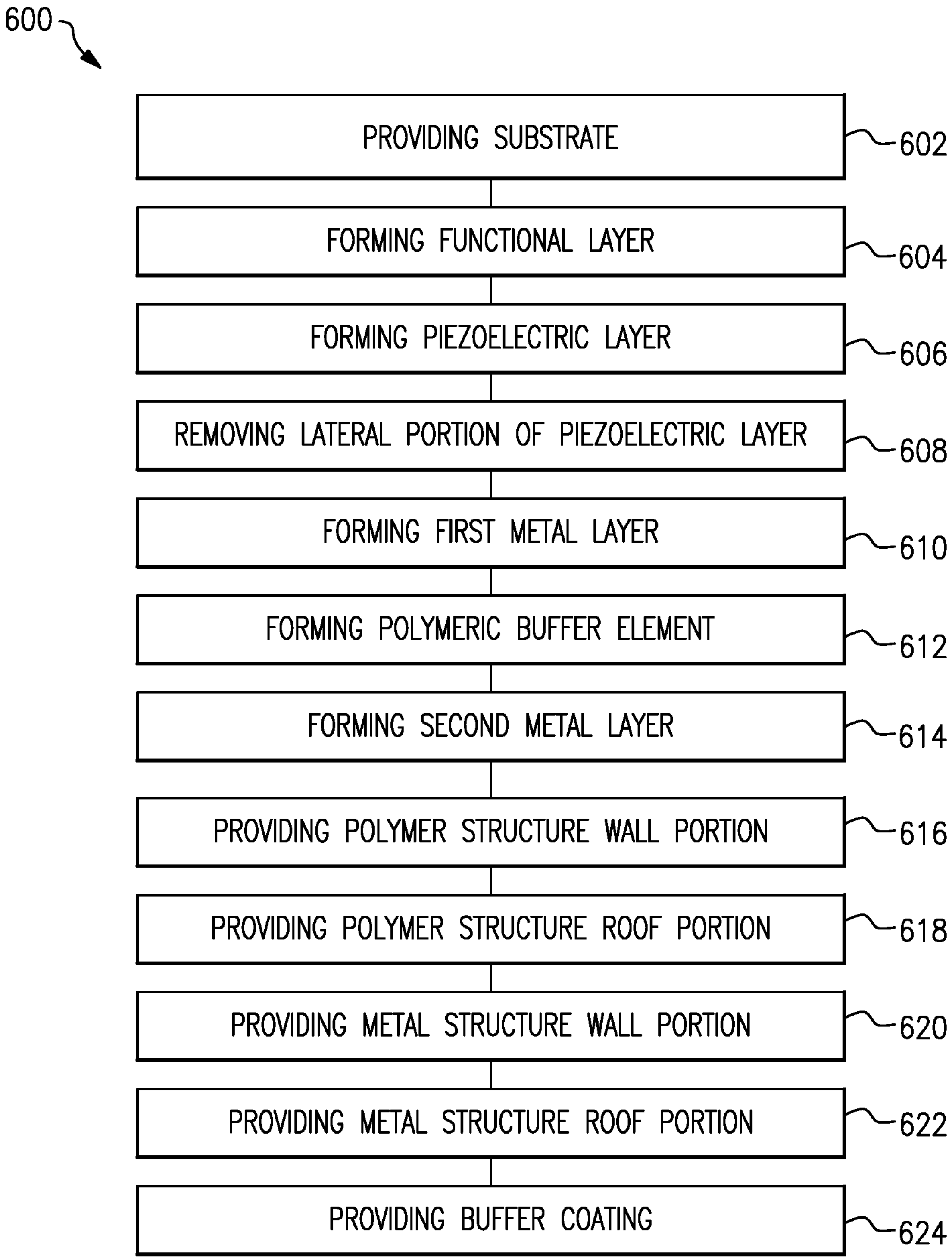
FIG. 6 illustrates a method of making the multi-layer piezoelectric substrate (MPS) package structure of FIGS. 1-4.

FIG. 6 illustrates a flowchart of a method 600 of making a packaged acoustic wave component (e.g., a multi-layer piezoelectric substrate (MPS) package or structure), such as the component 100, 200, 300 or 400 in FIGS. 1, 2, 3, and 4. The method 600 includes the step 602 of forming or providing a substrate (e.g., substrate 116). The method 600 includes the step 604 of forming or providing a functional (e.g., temperature compensation, dielectric) structure or layer (such as the functional layer 114, 214, 314) over the substrate. The method 600 includes the step 606 of forming or providing a piezoelectric structure or layer (such as the piezoelectric layer 112, 312) over the functional layer 114, 214, 314.

The method 600 includes a step 608 of removing (e.g., etching) a lateral portion (or: an outer edge or boundary) of the piezoelectric layer 112, 312 so as to uncover the peripheral portion 114A, 214A, 314A of the functional layer 114, 214, 314. In this step 608, also the peripheral portion 214A, 314A may be etched partially such that the thickness of the peripheral portion 214A, 314A is smaller than the thickness of the remaining, main portion 214B, 314B of the functional layer 214, 314. The etching step 608 may be performed such that the lateral edge of the piezoelectric layer 312 is slanted as has been described in the foregoing. In alternative solutions, wherein not only the piezoelectric layer 112, 312 is removed but also the peripheral portion 114A, 214A, 314A of the functional layer 114, 214, 314, it is precisely during or shortly after etching that re-activation of parasitic surface conductors due to oxidation may occur. This is prevented by aspects and embodiments disclosed herein.

The method 600 includes a step 610 of forming the first metal layer 110, 310 including the IDT electrode 111.

In an optional step 612, a polymeric buffer element 390 may be formed with the properties or features as has been described in the foregoing with respect to FIG. 4.

The method 600 further comprises a step 614 of forming the second metal layer 120, 320, 380. In further steps, the remainder of the thermally conductive structure in any of the described variants may be provided and attached to the intermediate product comprising the substrate 116. The remainder of the thermally conductive structure may be manufactured as a whole and then attached. Specifically, the thermally conductive structure comprises the buffer coating 106 comprising or consisting of a polymer material (such as a polyimide) and a filler material (such as a silica-based filler, e.g., silicon dioxide). The same may also apply to the polymer structure 109 as has been described in the foregoing.

Alternatively, the following steps may be performed: In a step 616, the polymer structure wall portion 109A is provided (in particular: formed). In a step 618, the polymer structure roof portion 109B is provided (in particular: formed) over the polymer structure wall portion 109A to form the cavity C. The material for the polymer structure wall portion 109A and/or the polymer structure roof portion 109B may comprise or consist of a polymer material in combination with a filler material, e.g., a polyimide with a silicon dioxide filler. In a step 620, a metal structure wall portion 108A is provided (in particular: formed) such as to cover the polymer structure wall portion 109A and to contact the second metal layer 120, 320, 380 in two or more locations where the second metal layer 120, 320, 380 tunnels through the polymer structure wall portion 109A. In this way, an electrically conductive connection is provided between the IDT electrodes 111 and the metal structure 108. In a further step 622, the remainder of the metal structure 108, in particular the metal structure roof portion 108B of the metal structure 108, is provided. Steps 620 and 622 could also be performed at the same time. In a further step 624, the buffer coating 106 comprising the polymer material and the filler material, e.g., a polyimide with a silicon dioxide filler, is provided.

In one implementation, a method of making a radio frequency module includes the steps above for method 600 in addition to forming or providing a package substrate and attaching additional circuitry and the packaged acoustic wave component to the package substrate.

Advantageously, the packaged acoustic wave component 100, 200, 300, 400 reduces signal cross talk as well as reduces the mechanical stress to which the piezoelectric and/or dielectric layers are subjected (e.g., during heat cycle testing due to the different thermal expansion characteristics of the substrate and the metal structure attached to the substrate) and avoid cracks or breaks therein. This results in improved reliability and mechanical ruggedness of the packaged acoustic wave components 100, 200, 300, 400. Such temperature performance advantageously allows use of the packaged acoustic wave components 100, 200, 300, 400 for high power applications (e.g., in a high power transmit filter). It also allows for a size reduction in the packaged acoustic wave component 100, 200, 300, 400, as described above.

An MPS acoustic wave resonator or device or die in a packaged acoustic wave component, including any suitable combination of features disclosed herein, can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS acoustic wave resonators as disclosed herein. FR1 can be from 410 MHz to 7.125 GHz, for example, as specified in a current 5G NR specification. In 5G applications, the thermal dissipation of the MPS acoustic wave resonators disclosed herein can be advantageous. For example, such thermal dissipation can be desirable in 5G applications with a higher time-division duplexing (TDD) duty cycle compared to fourth generation (4G) Long Term Evolution (LTE). One or more MPS acoustic wave resonators in accordance with any suitable principles and advantages disclosed herein can be included in a filter arranged to filter a radio frequency signal in a 4G LTE operating band and/or in a filter having a passband that includes a 4G LTE operating band and a 5G NR operating band.

Figure 7A:
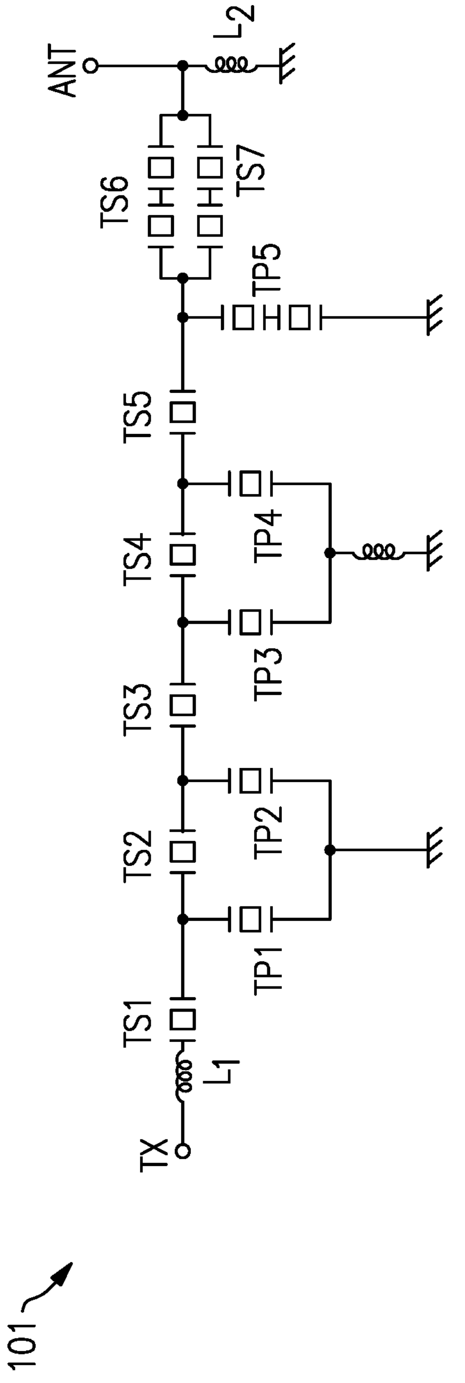
FIG. 7A is a schematic diagram of a transmit filter that includes a surface acoustic wave resonator according to an embodiment.

FIG. 7A is a schematic diagram of an example transmit filter 101 that includes surface acoustic wave resonators according to an embodiment. The transmit filter 101 can be a band pass filter. The illustrated transmit filter 101 is arranged to filter a radio frequency signal received at a transmit port TX and provide a filtered output signal to an antenna port ANT. Some or all of the SAW resonators TS1 to TS7 and/or TP1 to TP5 can be a SAW resonator in accordance with any suitable principles and advantages disclosed herein. For instance, one or more of the SAW resonators of the transmit filter 101 can be part of one or more of the packaged acoustic wave components such as the packaged acoustic wave components 100, 200, 300, 400 of any of FIGS. 1-4. Any suitable number of series SAW resonators and shunt SAW resonators can be included in a transmit filter 101.

Figure 7B:
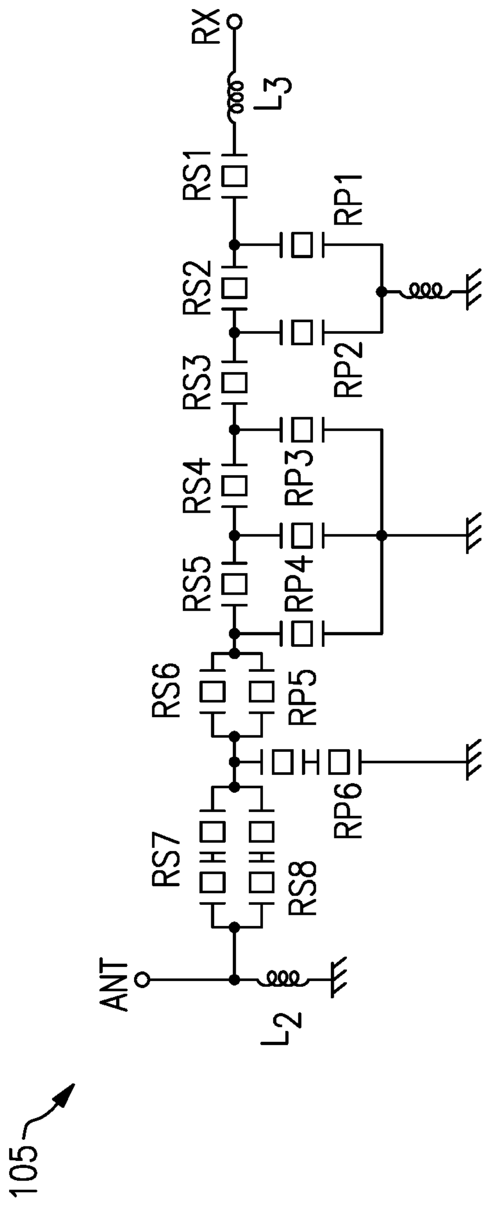
FIG. 7B is a schematic diagram of a receive filter that includes a surface acoustic wave resonator according to an embodiment.

FIG. 7B is a schematic diagram of a receive filter 105 that includes surface acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the SAW resonators RS1 to RS8 and/or RP1 to RP6 can be SAW resonators included in a packaged acoustic wave component in accordance with any suitable principles and advantages disclosed herein. For instance, one or more of the SAW resonators of the receive filter 105 can be part of one or more of the packaged acoustic wave components 100, 200, 300, 400 of any of FIGS. 1-4. Any suitable number of series SAW resonators and shunt SAW resonators can be included in a receive filter 105.

Although FIGS. 7A and 7B illustrate example ladder filter topologies, any suitable filter topology can include a SAW resonator in accordance with any suitable principles and advantages disclosed herein. Example filter topologies include ladder topology, a lattice topology, a hybrid ladder and lattice topology, a multi-mode SAW filter, a multi-mode SAW filter combined with one or more other SAW resonators, and the like.

Figure 8:
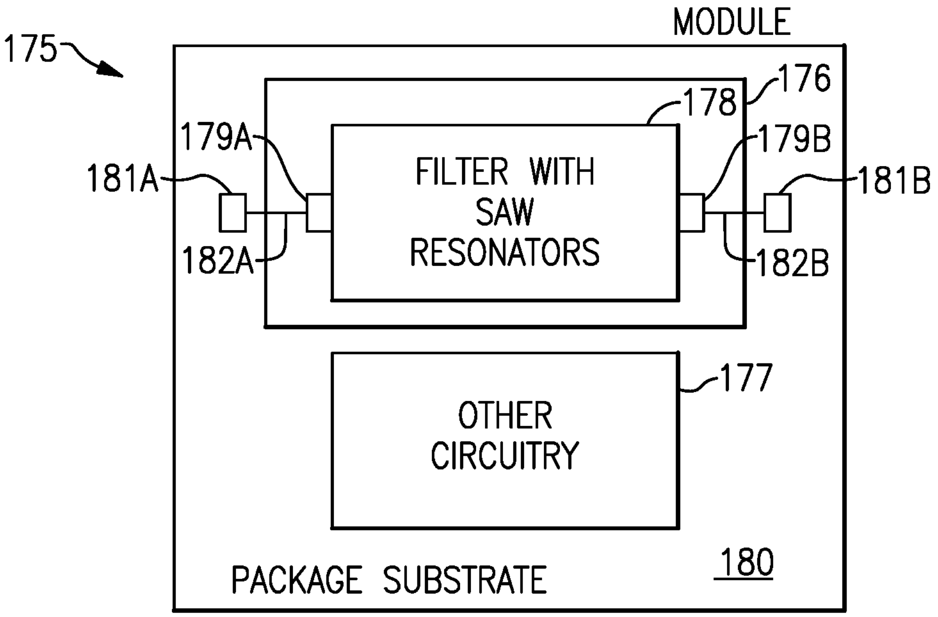
FIG. 8 is a schematic diagram of a radio frequency module that includes a surface acoustic wave resonator according to an embodiment.

FIG. 8 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators or packages disclosed herein. The SAW component 176 can include a SAW die that includes SAW resonators.

The SAW component 176 shown in FIG. 8 includes a filter 178 and terminals 179A and 179B. The filter 178 includes SAW resonators. One or more of the SAW resonators can be implemented in accordance with any suitable principles and advantages of the packaged acoustic wave components 100, 200, 300, 400 of any of FIGS. 1-4. The terminals 179A and 178B can serve, for example, as an input contact and an output contact. The SAW component 176 and the other circuitry 177 are on the same packaging substrate 180 in FIG. 8. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 9:
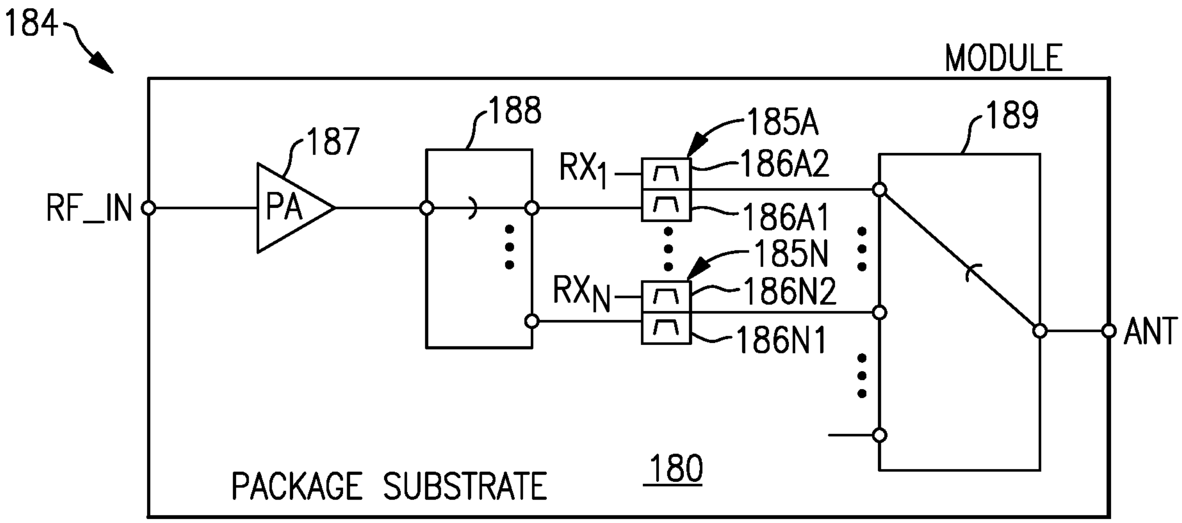
FIG. 9 is a schematic diagram of a radio frequency module that includes filters with surface acoustic wave resonators according to an embodiment.

FIG. 9 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on the same packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators or packages in accordance with any suitable principles and advantages disclosed herein. Similarly, one or more of the receive filters 186A2 to 186N2 can include one or more SAW resonators in accordance with any suitable principles and advantages disclosed herein. Although FIG. 9 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 10:
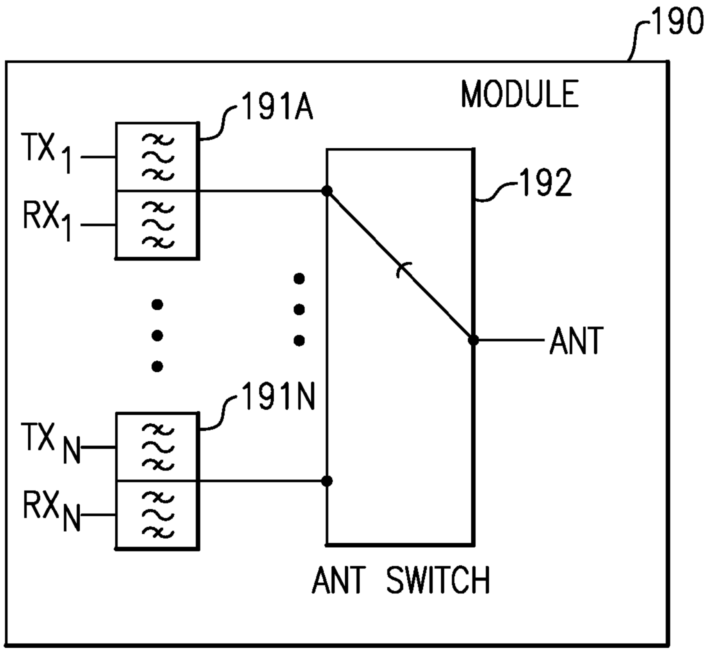
FIG. 10 is a schematic block diagram of a module that includes an antenna switch and duplexers that include a surface acoustic wave resonator according to an embodiment.

FIG. 10 is a schematic block diagram of a module 190 that includes duplexers 191A to 191N and an antenna switch 192. One or more filters of the duplexers 191A to 191N can include any suitable number of surface acoustic wave resonators or packages in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 11A:
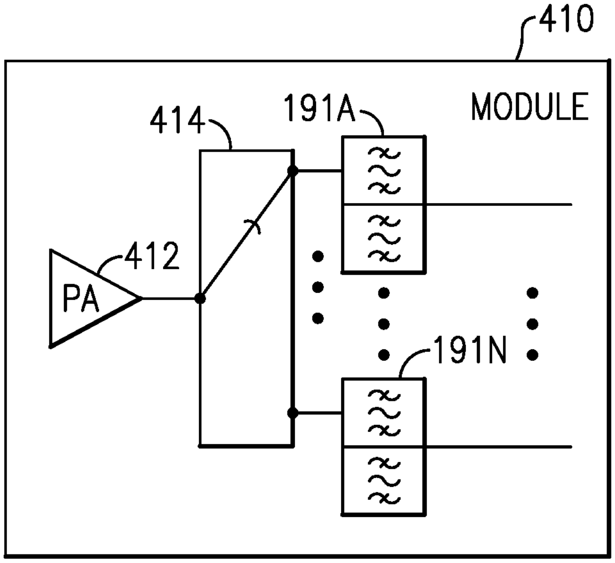
FIG. 11A is a schematic block diagram of a module that includes a power amplifier, a radio frequency switch, and duplexers that include a surface acoustic wave resonator according to an embodiment.

FIG. 11A is a schematic block diagram of a module 410 that includes a power amplifier 412, a radio frequency switch 414, and duplexers 191A to 191N in accordance with one or more embodiments. The power amplifier 412 can amplify a radio frequency signal. The radio frequency switch 414 can be a multi-throw radio frequency switch. The radio frequency switch 414 can electrically couple an output of the power amplifier 412 to a selected transmit filter of the duplexers 191A to 191N. One or more filters of the duplexers 191A to 191N can include any suitable number of surface acoustic wave resonators or packages in accordance with any suitable principles and advantages discussed herein. Any suitable number of duplexers 191A to 191N can be implemented.

Figure 11B:
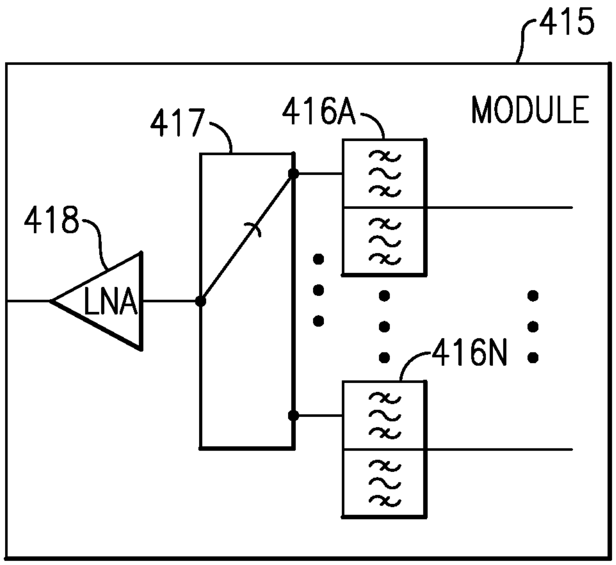
FIG. 11B is a schematic block diagram of a module that includes filters, a radio frequency switch, and a low noise amplifier according to an embodiment.

FIG. 11B is a schematic block diagram of a module 415 that includes filters 416A to 416N, a radio frequency switch 417, and a low noise amplifier 418 according to an embodiment. One or more filters of the filters 416A to 416N can include any suitable number of acoustic wave resonators or packages in accordance with any suitable principles and advantages disclosed herein. Any suitable number of filters 416A to 416N can be implemented. The illustrated filters 416A to 416N are receive filters. In some embodiments (not illustrated), one or more of the filters 416A to 416N can be included in a multiplexer that also includes a transmit filter. The radio frequency switch 417 can be a multi-throw radio frequency switch. The radio frequency switch 417 can electrically couple an output of a selected filter of filters 416A to 416N to the low noise amplifier 418. In some embodiments (not illustrated), a plurality of low noise amplifiers can be implemented. The module 415 can include diversity receive features in certain applications.

Figure 12A:
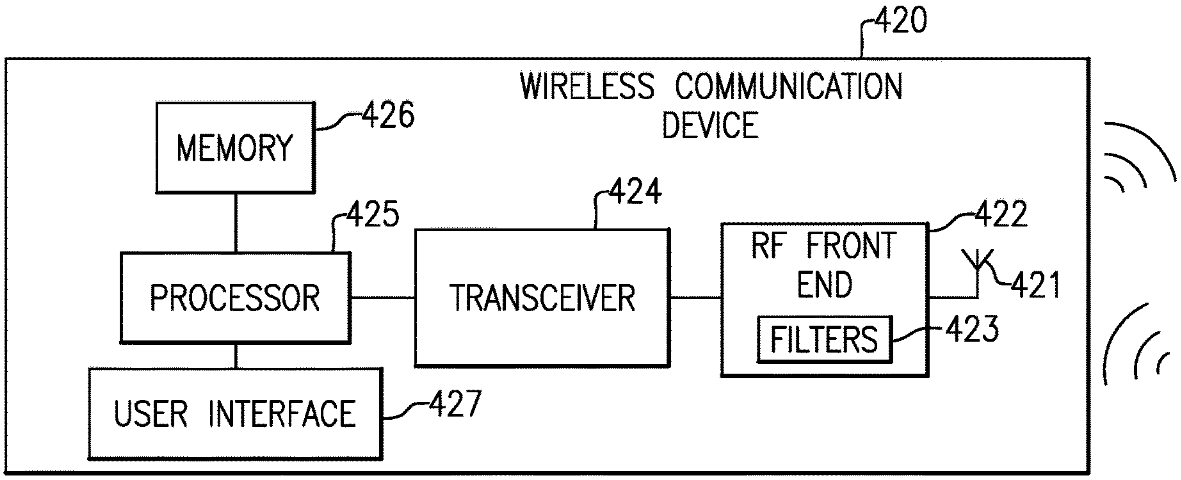
FIG. 12A is a schematic block diagram of a wireless communication device that includes a filter with a surface acoustic wave resonator in accordance with one or more embodiments.

FIG. 12A is a schematic diagram of a wireless communication device 420 that includes filters 423 in a radio frequency front end 422 according to an embodiment. The filters 423 can include one or more SAW resonators or packages in accordance with any suitable principles and advantages discussed herein. The wireless communication device 420 can be any suitable wireless communication device. For instance, a wireless communication device 420 can be a mobile phone, such as a smart phone. As illustrated, the wireless communication device 420 includes an antenna 421, an RF front end 422, a transceiver 424, a processor 425, a memory 426, and a user interface 427. The antenna 421 can transmit/receive RF signals provided by the RF front end 422. Such RF signals can include carrier aggregation signals. Although not illustrated, the wireless communication device 420 can include a microphone and a speaker in certain applications.

The RF front end 422 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 422 can transmit and receive RF signals associated with any suitable communication standards. The filters 423 can include SAW resonators of a SAW component or package that includes any suitable combination of features discussed with reference to any embodiments discussed above.

The transceiver 424 can provide RF signals to the RF front end 422 for amplification and/or other processing. The transceiver 424 can also process an RF signal provided by a low noise amplifier of the RF front end 422. The transceiver 424 is in communication with the processor 425. The processor 425 can be a baseband processor. The processor 425 can provide any suitable base band processing functions for the wireless communication device 420. The memory 426 can be accessed by the processor 425. The memory 426 can store any suitable data for the wireless communication device 420. The user interface 427 can be any suitable user interface, such as a display with touch screen capabilities.

Figure 12B:
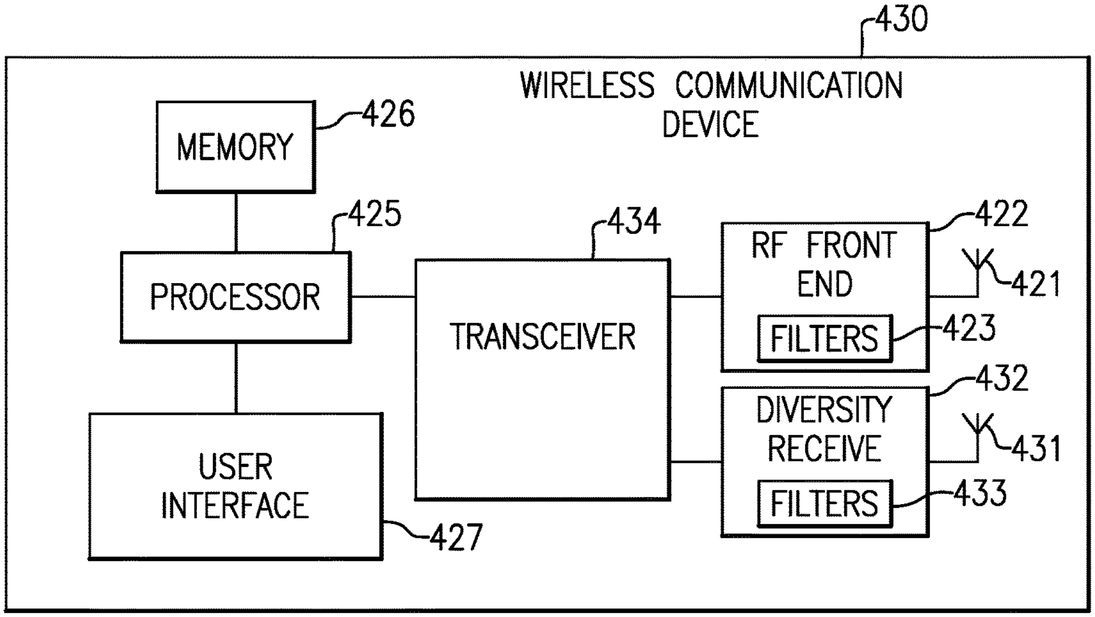
FIG. 12B is a schematic block diagram of another wireless communication device that includes a filter with a surface acoustic wave resonator in accordance with one or more embodiments.

FIG. 12B is a schematic diagram of a wireless communication device 430 that includes filters 423 in a radio frequency front end 422 and a second filter 433 in a diversity receive module 432. The wireless communication device 430 is like the wireless communication device 420 of FIG. 12A, except that the wireless communication device 430 also includes diversity receive features. As illustrated in FIG. 12B, the wireless communication device 430 includes a diversity antenna 431, a diversity module 432 configured to process signals received by the diversity antenna 431 and including filters 433, and a transceiver 434 in communication with both the radio frequency front end 422 and the diversity receive module 432. The filters 433 can include one or more SAW resonators or packaged acoustic wave components that include any suitable combination of features discussed with reference to any embodiments discussed above.

Although embodiments disclosed herein relate to surface acoustic wave resonators or packages and packaged acoustic wave components, any suitable principles and advantages disclosed herein can be applied to other types of acoustic wave resonators that include an IDT electrode, such as Lamb wave resonators and/or boundary wave resonators. For example, any suitable combination of features of the tilted and rotated IDT electrodes disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately," "about," "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged acoustic wave component comprising:

a substrate having a trap-rich layer arranged at a surface of the substrate;

a functional layer disposed over the surface of the substrate such as to cover that surface;

a piezoelectric layer disposed over the functional layer and covering the functional layer with an exception of a peripheral portion of the functional layer;

a first metal layer comprising an electrode structure disposed over the piezoelectric layer; and a second metal layer disposed partially in contact with the first metal layer and partially in contact with the peripheral portion of the functional layer.

2. The packaged acoustic wave component of claim 1 wherein the functional layer is a dielectric layer.

3. The packaged acoustic wave component of claim 1 wherein the peripheral portion of the functional layer completely surrounds the piezoelectric layer.

4. The packaged acoustic wave component of claim 1 wherein the peripheral portion of the functional layer has a smaller thickness than a remaining main portion of the functional layer.

5. The packaged acoustic wave component of claim 4 wherein the second metal layer comprises a transition portion arranged where the peripheral portion of the functional layer transitions into the remaining main portion of the functional layer.

6. The packaged acoustic wave component of claim 5 wherein the transition portion has in its cross-section a step shape comprising two angles of at least 90 degrees.

7. The packaged acoustic wave component of claim 6 wherein the step shape comprises two obtuse angles.

8. The packaged acoustic wave component of claim 5 wherein the second metal layer comprises an acute angle.

9. The packaged acoustic wave component of claim 5 wherein the transition portion comprises a V shape.

10. The packaged acoustic wave component of claim 1 wherein a peripheral edge of the piezoelectric layer is slanted away from the peripheral portion of the functional layer.

11. The packaged acoustic wave component of claim 1 wherein a peripheral edge of the first metal layer is slanted away from the peripheral portion of the functional layer.

12. The packaged acoustic wave component of claim 1 wherein the piezoelectric layer and the first metal layer have an overall tapered shape.

13. The packaged acoustic wave component of claim 1 wherein a polymeric buffer element is partially interposed between the second metal layer and the peripheral portion of the functional layer.

14. The packaged acoustic wave component of claim 13 wherein the second metal layer is in direct contact with the polymeric buffer element as well as with the peripheral portion of the functional layer.

15. The packaged acoustic wave component of claim 1 further comprising:

a polymer structure including a polymer structure wall portion and a polymer structure roof portion configured to form a cavity over the electrode structure;

a metal structure disposed over the polymer structure; and a buffer coating disposed over the metal structure.

16. A wireless communication device including a radio frequency module, the radio frequency module comprising a packaged acoustic wave component comprising:

a substrate having a trap-rich layer arranged at a surface of the substrate;

a functional layer disposed over the surface of the substrate such as to cover that surface;

a piezoelectric layer disposed over the functional layer and covering the functional layer with an exception of a peripheral portion of the functional layer;

a first metal layer including an electrode structure disposed over the piezoelectric layer; and a second metal layer disposed partially in contact with the first metal layer and partially in contact with the peripheral portion of the functional layer.

* * * * *